(12) United States Patent
Joshi et al.

(10) Patent No.: US 10,121,859 B2
(45) Date of Patent: Nov. 6, 2018

(54) METHOD OF MANUFACTURING SEMICONDUCTOR DEVICES WITH TRANSISTOR CELLS AND SEMICONDUCTOR DEVICE

(71) Applicant: Infineon Technologies AG, Neubiberg (DE)

(72) Inventors: Ravi Keshav Joshi, Villach (AT); Johannes Baumgartl, Riegersdorf (AT); Oliver Blank, Villach (AT); Oliver Hellmund, Neubiberg (DE); Martin Poelzl, Ossiach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 16 days.

(21) Appl. No.: 15/457,833

(22) Filed: Mar. 13, 2017

(65) Prior Publication Data

US 2017/0271446 A1   Sep. 21, 2017

(30) Foreign Application Priority Data

Mar. 17, 2016   (DE) .......... 10 2016 104 968

(51) Int. Cl.
| | |
|---|---|
| H01L 29/06 | (2006.01) |
| H01L 29/10 | (2006.01) |
| H01L 29/08 | (2006.01) |
| H01L 21/78 | (2006.01) |
| H01L 21/68 | (2006.01) |

(Continued)

(52) U.S. Cl.
CPC .......... *H01L 29/0696* (2013.01); *B81B 7/008* (2013.01); *B81C 1/00246* (2013.01); *H01L 21/6835* (2013.01); *H01L 21/78* (2013.01); *H01L 29/0865* (2013.01); *H01L 29/1095* (2013.01); *H01L 29/404* (2013.01); *H01L 29/407* (2013.01); *H01L 29/7811* (2013.01); *H01L 29/7813* (2013.01);

(Continued)

(58) Field of Classification Search
CPC ............ H01L 29/0696; H01L 29/0865; H01L 29/1095; H01L 29/404; H01L 29/407; H01L 29/7811; H01L 29/7813; H01L 21/6835; H01L 21/78
See application file for complete search history.

(56) References Cited

U.S. PATENT DOCUMENTS

| | | | | |
|---|---|---|---|---|
| 4,651,407 A | * | 3/1987 | Bencuya | H01L 29/0649 148/DIG. 111 |
| 6,734,520 B2 | * | 5/2004 | Kapels | H01L 29/0649 257/483 |

(Continued)

FOREIGN PATENT DOCUMENTS

| | | |
|---|---|---|
| DE | 102007044209 A1 | 3/2009 |
| JP | 2006237056 A | 9/2006 |

*Primary Examiner* — Christine Enad
(74) *Attorney, Agent, or Firm* — Slater Matsil, LLP

(57) ABSTRACT

First reinforcement stripes are formed on a process surface of a base substrate. A first epitaxial layer covering the first reinforcement stripes is formed on the first process surface. Second reinforcement stripes are formed on the first epitaxial layer. A second epitaxial layer covering the second reinforcement stripes is formed on exposed portions of the first epitaxial layer. Semiconducting portions of transistor cells are formed in or portions of micro electromechanical structures are formed from the second epitaxial layer.

22 Claims, 17 Drawing Sheets

(51) Int. Cl.
*H01L 21/683* (2006.01)
*B81B 7/00* (2006.01)
*B81C 1/00* (2006.01)
*H01L 29/40* (2006.01)
*H01L 29/78* (2006.01)

(52) U.S. Cl.
CPC . *B81B 2207/015* (2013.01); *B81C 2203/0707* (2013.01); *H01L 2221/68327* (2013.01)

(56) References Cited

U.S. PATENT DOCUMENTS

2013/0175576 A1* 7/2013 Blanchard .......... H01L 29/8611
  257/141
2015/0236142 A1* 8/2015 Laven ................ H01L 21/2254
  257/66
2016/0308072 A1* 10/2016 Uchida ................ H01L 29/872

* cited by examiner

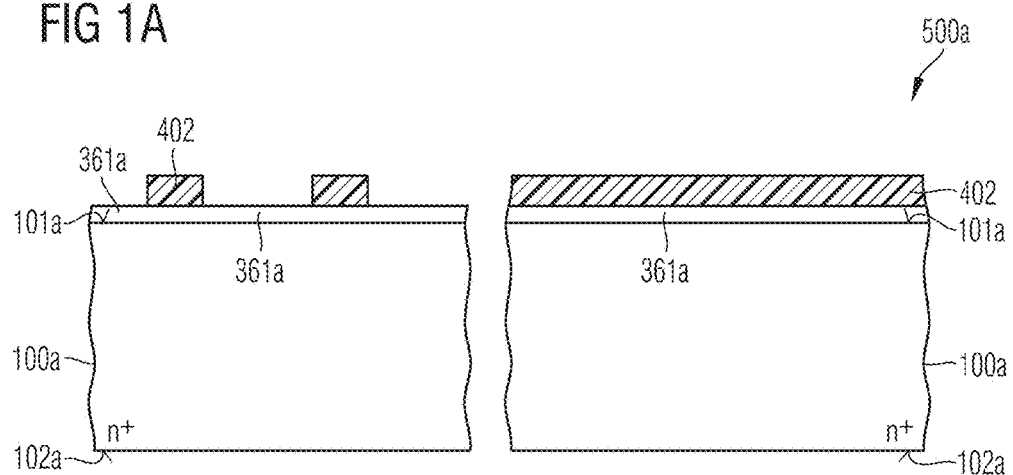
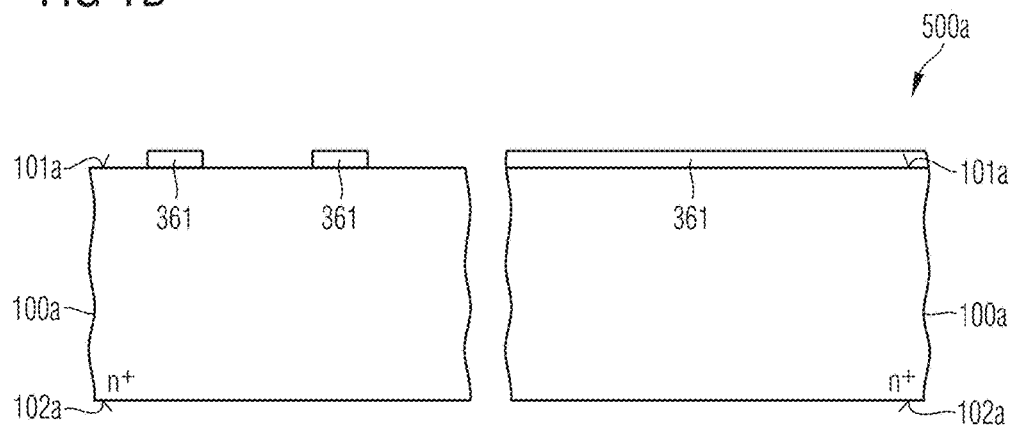

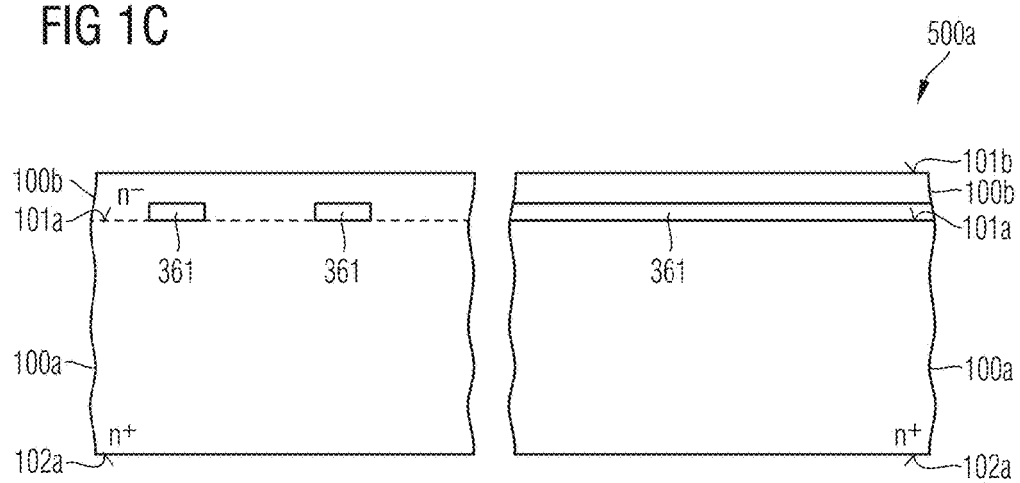
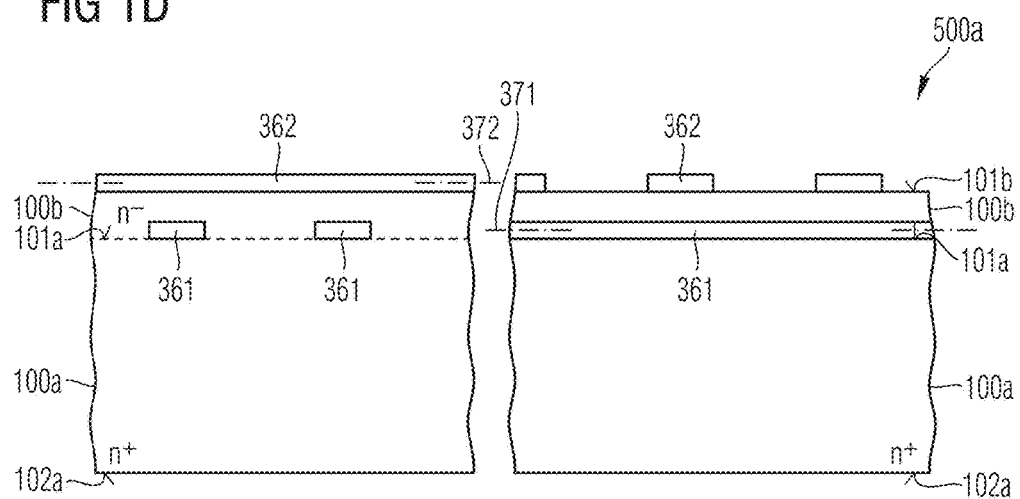

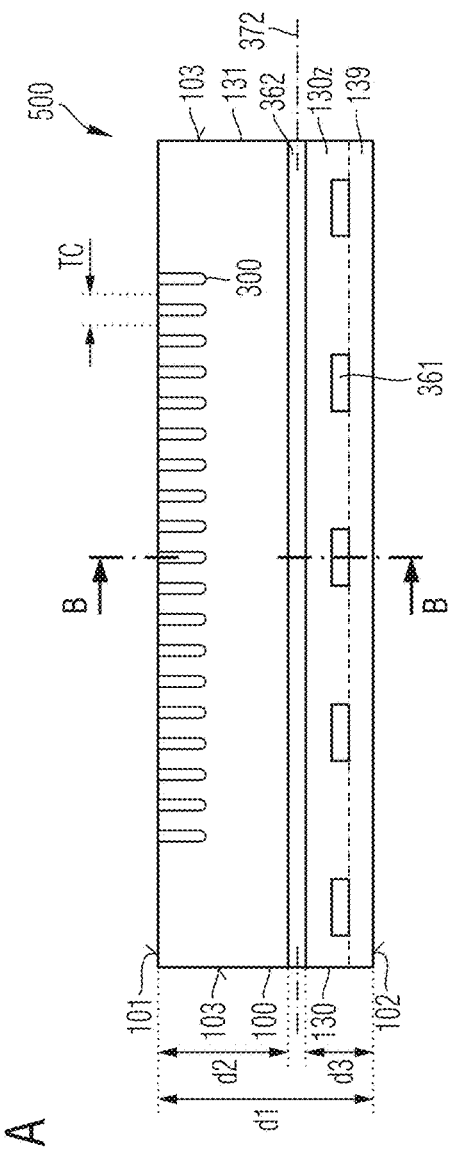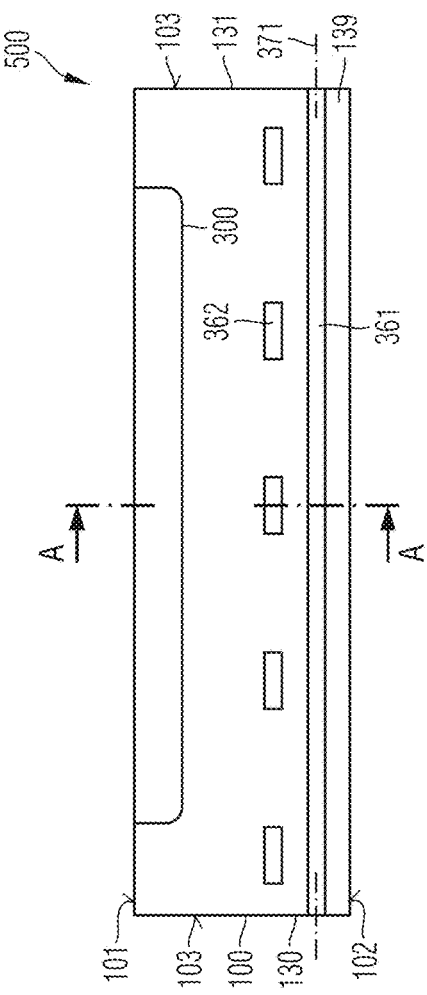

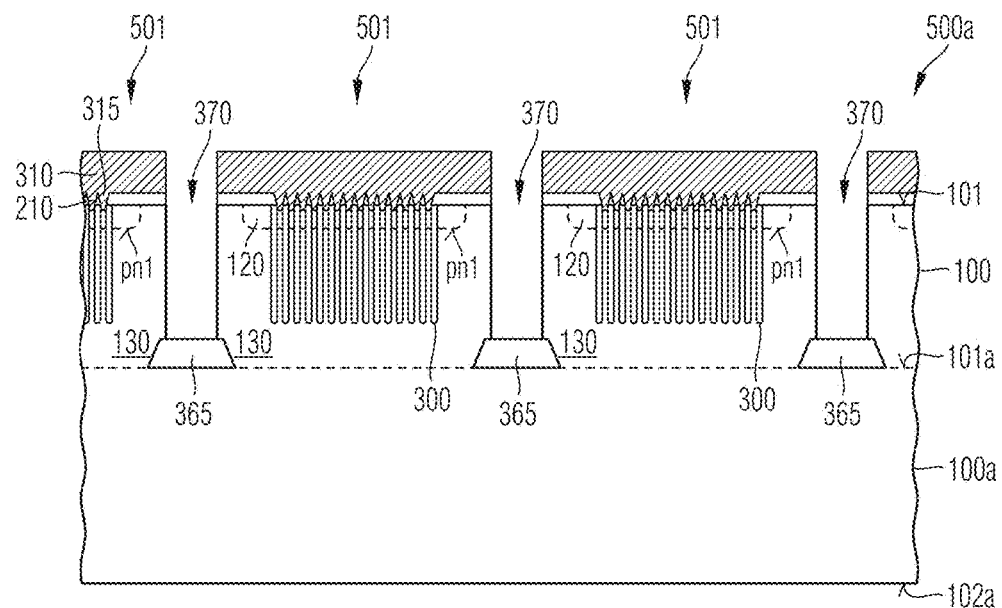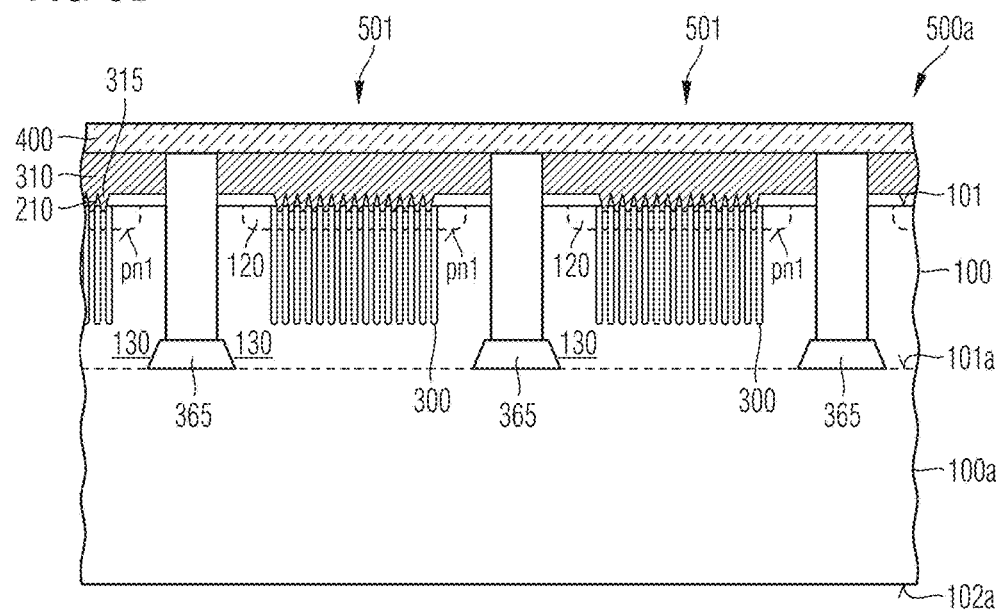

METHOD OF MANUFACTURING SEMICONDUCTOR DEVICES WITH TRANSISTOR CELLS AND SEMICONDUCTOR DEVICE

This application claims priority to German patent application 10 2016 104 968.9, filed Mar. 17, 2016, which application is hereby incorporated herein by reference in its entirety.

TECHNICAL FIELD

The present invention relates generally to a method of manufacturing semiconductor devices and transistor cells and a semiconductor device.

BACKGROUND

With shrinking dimensions of semiconductor devices such as power semiconductor switching devices, comparatively thin semiconductor wafers have to be handled in a process environment. With decreasing thickness of the semiconductor wafers trench structures including oxide layers and extending from the front side into the semiconductor wafer as well as thick metal layers on the wafer surface bend and warp the wafer to a significant degree. Wafer warping and wafer bowing increase process complexity, e.g., for a wafer dicing process that obtains separated semiconductor dies from a semiconductor wafer. During fabrication, auxiliary carriers and/or stress relaxing features at the front side may reduce wafer warpage and wafer bowing.

It is desirable to provide economic methods for manufacturing semiconductor devices that reduce wafer bowing and/or that simplify wafer dicing.

SUMMARY

According to an embodiment a semiconductor device includes transistor cells that include body regions forming first pn junctions with a drift structure in a semiconductor portion. First longitudinal axes of first reinforcement stripes in the semiconductor portion are parallel to a first surface of the semiconductor portion. Second longitudinal axes of second reinforcement stripes between the first reinforcement stripes and the first surface are parallel to the first surface.

According to another embodiment a method of manufacturing a semiconductor device includes forming first reinforcement stripes on a process surface of a base substrate. A first epitaxial layer is formed on the process surface, wherein the first epitaxial layer covers the first reinforcement stripes. Second reinforcement stripes are formed on the first epitaxial layer. A second epitaxial layer is formed on exposed portions of the first epitaxial layer, wherein the second epitaxial layer covers the second reinforcement stripes. Semiconducting portions of transistor cells are formed in or portions of micro electromechanical structures are formed from the second epitaxial layer.

According to a further embodiment a method of manufacturing a semiconductor device includes forming dicing stripes on a process surface of a base substrate. An epitaxial layer is formed on the process surface and covers the dicing stripes. Semiconducting portions of transistor cells are formed in or portions of micro electromechanical structures are formed from the epitaxial layer. Dicing trenches are formed in a vertical projection of the dicing stripes. The dicing trenches separate the semiconductor portions of semiconductor dies. An auxiliary carrier is attached at a front side of the semiconductor dies opposite to the base substrate. The base substrate is removed. The semiconductor dies are separated from each other by at least partially removing the dicing stripes.

According to a further embodiment a semiconductor device includes micro electromechanical structures. First longitudinal axes of first reinforcement stripes in the semiconductor portion are parallel to a first surface of the semiconductor portion. Second longitudinal axes of second reinforcement stripes between the first reinforcement stripes and the first surface are parallel to the first surface.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A includes two orthogonal vertical cross-sectional views of a portion of a semiconductor substrate for illustrating a method of manufacturing a semiconductor device with buried reinforcement stripes in two different planes, after forming a mask on a first reinforcement layer;

FIG. 1B includes two orthogonal vertical cross-sectional views of the semiconductor substrate portion of FIG. 1A, after forming first reinforcement stripes from the first reinforcement layer;

FIG. 1C includes two orthogonal vertical cross-sectional views of the semiconductor substrate portion of FIG. 1B, after forming a first epitaxial layer;

FIG. 1D includes two orthogonal vertical cross-sectional views of the semiconductor substrate portion of FIG. 1C, after forming second reinforcement stripes on the first epitaxial layer;

FIG. 2A is a schematic vertical cross-sectional view of a semiconductor device with orthogonal reinforcement stripes in different planes according to an embodiment;

FIG. 2B is a schematic vertical cross-sectional view of the semiconductor device of FIG. 2A along line B-B;

FIG. 6C is a schematic vertical cross-sectional view of the semiconductor substrate portion of FIG. 6B, after completing front side processes and forming dicing trenches exposing the dicing stripes;

FIG. 6D is a schematic vertical cross-sectional view of the semiconductor substrate portion of FIG. 6C, after attaching an auxiliary carrier at a front side of the semiconductor substrate;

DETAILED DESCRIPTION OF ILLUSTRATIVE EMBODIMENTS

Figure 1E:
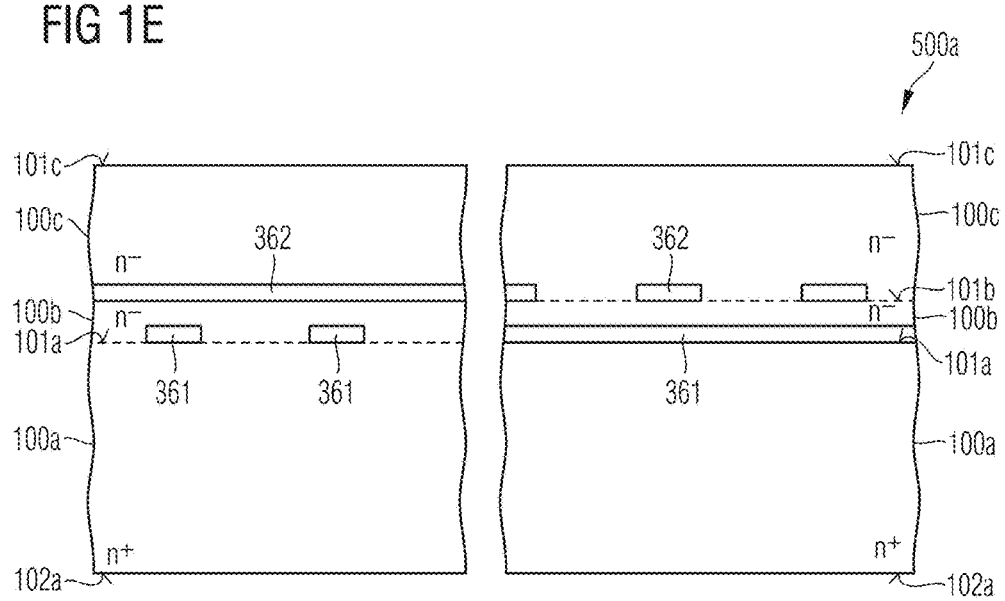
FIG. 1E includes two orthogonal vertical cross-sectional views of the semiconductor substrate portion of FIG. 1D, after forming a second epitaxial layer.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The embodiments are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor material. The term "electrically coupled" includes that one or more intervening element(s) adapted for signal transmission may be between the electrically coupled elements, for example, elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1G concern a process for manufacturing a semiconductor device with at least two sets of reinforcement structures in different layers, wherein longitudinal axes of the reinforcement structures of the two sets are parallel or tilted to each other. The semiconductor substrate 500a includes a base substrate bow, wherein along a process surface 101a the base substrate bow includes a layer of a semiconductor material. For example, the base substrate bow is a semiconductor wafer of silicon, germanium or a silicon germanium crystal. According to other embodiments, the base substrate bow may include a dielectric portion. For example, the base substrate 100a is an SOI (silicon-on-insulator) wafer or an SOG (silicon-on-glass) wafer.

The process surface 101a of the base substrate 100a defines a front side of the semiconductor substrate 500a. A support surface 102a on the back is parallel to the process surface 101a. Directions parallel to the process surface 101a are horizontal directions and a direction perpendicular to the process surface 101a is a vertical direction.

A first reinforcement layer 361a is formed on the process surface 101a. The first reinforcement layer 361a may be formed by thermal oxidation of the underlying semiconductor material of the base substrate bow or by a deposition process. A resist layer may be deposited on the first reinforcement layer 361a and patterned by lithography to obtain a resist mask 402.

FIG. 1A shows the resist mask 402 with stripe-shaped mask sections on the first reinforcement layer 361a, which is formed on the process surface 101a. The material of the first reinforcement layer 361a may be conductive, semiconducting, or insulating. For example, the material of the first reinforcement layer 361a may be thermally grown semiconductor oxide, for example silicon oxide, deposited semiconductor oxide, for example deposited silicon oxide, semiconductor nitride, for example silicon nitride, semiconductor oxynitride, for example silicon oxynitride, silicon carbide, or carbon, e.g., DLC (diamond-like carbon). According to a further embodiment the material of the first reinforcement layer 361a is or contains a metal, e.g., tungsten W.

Using the first resist mask 402 as etch mask, an etch process, for example, a plasma etch removes exposed portions of the first reinforcement layer 361a.

FIG. 1B shows first reinforcement stripes 361 formed on the process surface 101a of the base substrate bow. A vertical extension of the first reinforcement stripes 361 may be in a range from 50 nm to 50 µm, e.g., 20 µm or 5 µm, by way of example. A center-to-center distance between neighboring first reinforcement stripes 361 may be in a range from 100 nm to 100 µm. A width of the first reinforcement stripes 361 may be in a range from 500 nm to 10 µm. The first reinforcement stripes 361 may extend through a complete process portion of the base substrate bow. According to an embodiment, the first reinforcement stripes 361 have a length in a range from 100 µm to several millimeters or several centimeters, wherein the longitudinal axes of several separated first reinforcement stripes 361 coincide.

A first epitaxial layer 100b is formed by epitaxy on exposed portions of the process surface 101a between the first reinforcement stripes 361. During epitaxy, semiconductor atoms grow in registry with the crystal lattice of the semiconductor layer of the base substrate bow.

The first epitaxial layer 100b covers the first reinforcement stripes 361. For example, parameters of the epitaxy may be adjusted to achieve a sufficient lateral growth across the first reinforcement stripes 361. According to another embodiment, an epitaxy layer obtained by epitaxial growth may be subjected to a heat treatment that at least partially fluidifies the epitaxy layer, wherein the re-crystallized epitaxial layer covers the first reinforcement stripes 361 without leaving voids in the vertical projection of the first reinforcement stripes 361.

For example, after epitaxy of at least a portion of the first epitaxial layer 100b, the semiconductor substrate 500a may be subjected to a heating treatment in a hydrogen-containing ambient at temperatures above 900° C., e.g., between 1050° C. and 1150° C. for at least five minutes or longer. Due to the high surface mobility of silicon atoms in the hydrogen-containing atmosphere, the epitaxial layer becomes viscous and a slowly moving flow of viscous silicon laterally covers the first reinforcement stripes 361. The auxiliary surface 101b of the first epitaxial layer 100b may be polished and planarized, for example by CMP (chemical mechanical polishing).

FIG. 1C shows the first epitaxial layer 100b with a planar auxiliary surface 101b. The first epitaxial layer 100b covers the first reinforcement stripes 361. A vertical extension or thickness of the first epitaxial layer 100b may be in a range from 1 µm to 200 µm.

Second reinforcement stripes 362 are formed on the auxiliary surface 101b in the same or in a similar way as the first reinforcement stripes 361.

FIG. 1D shows the second reinforcement stripes 362 on the auxiliary surface 101b. Second longitudinal axes 372 of the second reinforcement stripes 362 run parallel or tilted to first longitudinal axes 371 of the first reinforcement stripes 361. According to the illustrated embodiment, the second longitudinal axes 372 of the second reinforcement stripes 362 are orthogonal to the first longitudinal axes 371 of the first reinforcement stripes 361. Both the first and the second reinforcement stripes 361, 362 run parallel to the support surface 102a and to the auxiliary surface 101b. Material configuration, dimensions and pitch of the second reinforcement stripes 362 may be the same as for the first reinforcement stripes 361 or may differ from material configuration, dimensions and pitch of the first reinforcement stripes 361. The first and second reinforcement stripes 361, 362 are separated from each other along the vertical axis of the semiconductor substrate 500a.

Forming an epitaxial layer and forming reinforcement stripes may be repeated, e.g., once or twice such that three or more planes with reinforcement stripes are successively formed.

A second epitaxial layer 100c is formed on exposed portions of the auxiliary surface 101b of the first epitaxial layer 100b, wherein process parameters of the epitaxy process may be adjusted such that the second epitaxial layer 100c sufficiently overgrows the second reinforcement stripes 362. Alternatively, the second epitaxial layer 100c may be at least partially fluidified and recrystallized after deposition of at least a portion of the second epitaxial layer 100c as described above.

FIG. 1E shows the semiconductor substrate 500a including the base substrate bow, a first epitaxial layer 100b mainly between the first and second reinforcement stripes 361, 362 and the second epitaxial layer 100c with a planar main surface 101c.

Front side processing may form, e.g., portions of micro electromechanical structures from a section of the second epitaxial layer 100c at the front side defined by the main surface 101c of the second epitaxial layer 100c. According to the illustrated embodiment, the front side processing includes formation of transistor cells at the front side, wherein formation of the transistor cells TC may include forming trench structures 300 extending from the main surface 101c of the second epitaxial layer 100c. The trench structures 300 may include conductive structures such as gate electrodes 155 and field electrodes 165 for field compensation, wherein dielectric material, for example, silicon oxide separates the conductive structures from the material of the second epitaxial layer 100c. Formation of the transistor cells TC may also include deposition of an interlayer dielectric 210 on the main surface 101c and forming a thick front side metallization including a first load electrode 310 on the interlayer dielectric 210.

Figure 1F:
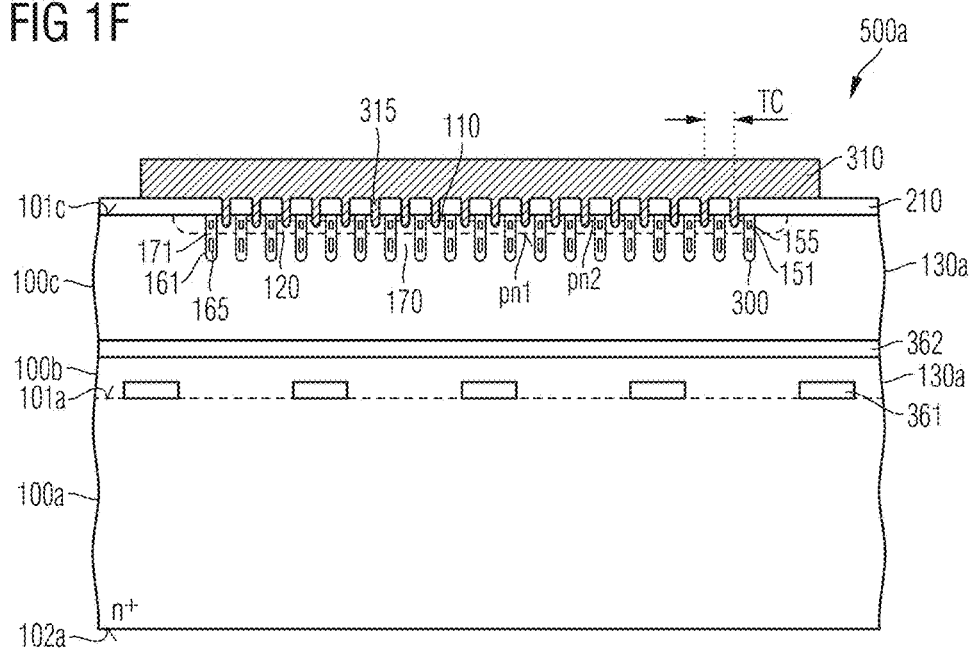
FIG. 1F is a vertical cross-sectional view of the semiconductor substrate portion of FIG. 1E, after forming transistor cells in the second epitaxial layer.

FIG. 1F shows the semiconductor substrate 500a with transistor cells TC formed at a front side. The transistor cells TC are electrically connected in parallel to each other. Trench structures 300 that extend from the main surface 101c into the second epitaxial layer 100c include gate electrodes 155, gate dielectrics 151, which separate the gate electrodes 155 from the second epitaxial layer 100c, field electrodes 165, field dielectrics 161 separating the field electrodes 165 from the second epitaxial layer 100c and separation dielectrics 171 separating the gate electrodes 155 and the field electrodes 165 from each other. In mesa sections 170 of the second epitaxial layer 100c between neighboring trench structures 300 body regions 120 of the transistor cells TC form first pn junctions pn1 with a precursor drift structure 130a in the second epitaxial layer 100c and second pn junctions pn2 with source regions no formed between the main surface low and the body regions 120.

An interlayer dielectric 210 covers the main surface low. First contact structures 315 extending through the interlayer dielectric 210 electrically connect the first load electrode 310 with the source regions 110 and the body regions 120 in the mesa sections 170 of the second epitaxial layer 100c.

According to other embodiments the trench structures 300 include only one conductive structure, for example gate electrodes or field electrodes. The trench structures 300 may be needle-shaped with both lateral dimensions within the same order of magnitude, e.g., approximately equal, or may be stripe-shaped with a longitudinal horizontal extension exceeding at least ten times a transverse horizontal extension.

The semiconductor substrate 500a is thinned from the side of the support surface 102a. Thinning may include a grinding process removing the base substrate bow completely or at least partially, wherein the resulting rear side surface of the semiconductor substrate 500a on the back is planar and parallel to the main surface 101c. After thinning, further implants, patterning and/or deposition processes may be performed effective on the rear side surface on the back of the semiconductor substrate 500a to finalize a drift structure 130. For example, dopants may be implanted to form a field stop layer and/or a heavily doped contact portion along the rear side surface. A metal may be deposited to form a back side metallization including a second load electrode 320.

The semiconductor substrate 500a may be diced, for example sawed or etched through along kerf lines to obtain a plurality of identical semiconductor devices 500 from the semiconductor substrate 500a.

Figure 1G:
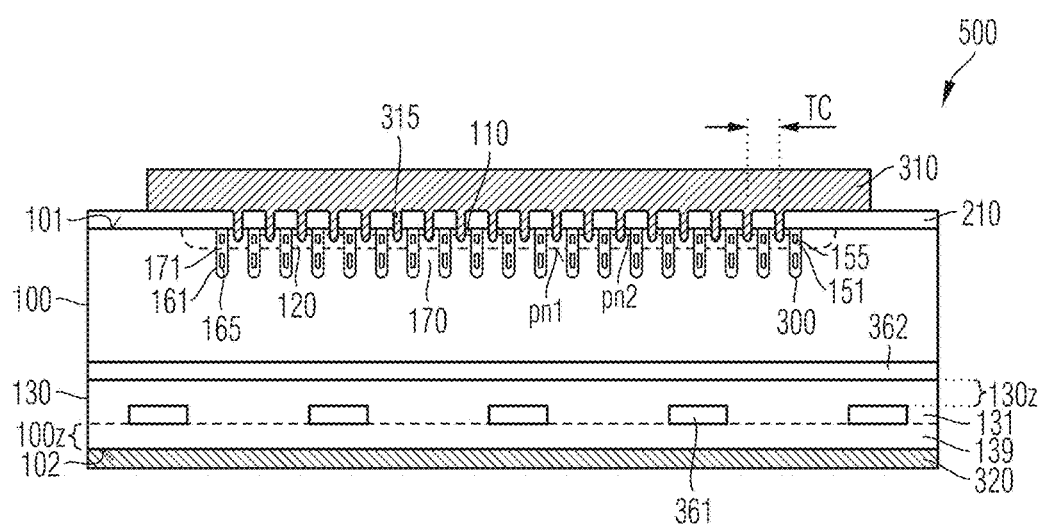
FIG. 1G is a schematic vertical cross-sectional view of a semiconductor device obtained by thinning and dicing the semiconductor substrate of FIG. 1F.

FIG. 1G shows a semiconductor device 500 obtained by dicing the semiconductor substrate 500a of FIG. 1F.

The semiconductor device 500 includes a semiconductor portion 100 formed from portions of the base substrate bow, the first epitaxial layer 100b and the second epitaxial layer 100c of the semiconductor substrate 500a of FIG. 1F, wherein a first surface 101 of a front side of the semiconductor portion 100 corresponds to the main surface 101c of the semiconductor substrate 500a of FIG. 1F and on the back the thinning produces a second surface 102 of the semiconductor portion 100.

An intermediate section 100z of the semiconductor portion 100, which includes remnants of the base substrate bow of FIG. 1F, may separate the first reinforcement stripes 361 from the second metallization with the second load electrode 320 on the back of the semiconductor device 500. A vertical extension of the intermediate section 100z may be in a range from 0 to 100 µm, for example in a range from 500 nm to 5 µm.

The drift structure 130 includes a drift zone 131 formed from portions of the first and second epitaxial layers 100b, 100c of FIG. 1F and further includes a heavily doped contact portion 139. The heavily doped contact portion 139 has the same conductivity type as the drift zone 131 in case the semiconductor device 500 is an IGFET (insulated gate field effect transistor) or has the complementary conductivity types in case the semiconductor device 500 is a reverse-blocking IGBT (insulated gate bipolar transistor). For reverse conducting IGBTs, the contact portion 139 may include zones of both conductivity types. A separation section 130z of the drift structure 130 may separate the second reinforcement stripes 362 from the first reinforcement stripes 361.

FIGS. 2A to 2B refer to a semiconductor device 500, which may be obtained from the process described with reference to FIGS. 1A to 1F.

The semiconductor device 500 may include a plurality of identical transistor cells TC and may be or may include an IGFET, for example, an MOSFET (metal oxide semiconductor FET) in the usual meaning including FETs with metal gates as well as FETs with semiconductor gates. According to another embodiment the semiconductor device 500 may be an IGBT or an MCD (MOS controlled diode).

A semiconductor portion 100 is of a single crystalline semiconductor material such as silicon (Si), germanium (Ge), a silicon germanium crystal (SiGe), or an $A_mB_v$ semiconductor.

The semiconductor portion 100 has a first surface 101 and a second surface 102 parallel to the first surface 101. The distance between the first and second surfaces 101, 102 is related to a voltage blocking capability the semiconductor device 500 is specified for, may be at least 15 µm and may range up to several 100 µm. A lateral outer surface 103 tilted to the first and second surfaces 101, 102 connects the first and second surfaces 101, 102.

The semiconductor portion 100 includes a drift structure 130 that includes a drift zone 131 of a first conductivity type as well as a contact portion 139 between the drift zone 131 and the second surface 102. In the drift zone 131, a dopant concentration may gradually or in steps increase or decrease with increasing distance to the first surface 101 at least in portions of its vertical extension. According to other embodiments, the dopant concentration in the drift zone 131 may be approximately uniform. For a silicon-based semiconductor portion 100 the mean dopant concentration in the drift zone 131 may be between 1E15 cm$^{-3}$ and 1E17 cm$^{-3}$, for example, in a range from 5E15 cm$^{-3}$ to 5E16 cm$^{-3}$.

A dopant concentration in the contact portion 139 along the second surface 102 is sufficiently high to form an ohmic contact with a metal directly adjoining the second surface 102. In case the semiconductor portion 100 is based on silicon, in an n-conductive contact portion 139 the dopant concentration along the second surface 102 may be at least 1E18 cm$^{-3}$, for example at least 5E19 cm$^{-3}$. In a p-conductive contact portion 139, the dopant concentration may be at least 1E16 cm$^{-3}$, for example at least 5E17 cm$^{-3}$. For IGFETs the contact portion 139 has the same conductivity as the drift zone 131. For IGBTs the contact portion 139 may have the complementary second conductivity type or may include zones of both conductivity types.

The drift structure 130 may include further doped regions, e.g., a field stop layer or a buffer zone between the drift zone 131 and the contact portion 139, barrier zones as well as counterdoped regions.

A plurality of trench structures 300 extend from the first surface 101 into the semiconductor portion 100. The trench structures 300 may form a regular stripe pattern including regularly arranged stripe-shaped trench structures 300.

According to another embodiment the trench structures 300 may be connected to each other and form a grid pattern. According to a further embodiment the trench structures 300 are needle-shaped with both horizontal lateral dimensions within the same order of magnitude or approximately equal. The trench structures 300 may be completely filled with dielectric materials or may include one, two or more conductive structures separated from each other. For example, the trench structures 300 may include at least one of a gate electrode and a field electrode.

First reinforcement stripes 361 are formed at a first distance d1 to the first surface 101 and second reinforcement stripes 362 are formed at a second distance d2 to the first surface 101, wherein d2 is smaller than d1. First longitudinal axes 371 of the first reinforcement stripes 361 are parallel to the first surface 101 and tilted, e.g., orthogonal to second longitudinal axes 372 of the second reinforcement stripes 362.

The first reinforcement stripes 361 may directly adjoin to the second surface 102 or may be formed at a distance to the second surface 102. For example, the first reinforcement stripes 361 may be formed between the contact portion 139 and the drift zone 131. According to other embodiments, the first reinforcement stripes 361 may be formed at a distance to the contact portion 139.

A separation section 130z of the drift structure 130 separates the second reinforcement stripes 362 from the first reinforcement stripes 361. A vertical extension d3 of the separation section 130z may be in a range from 0 to 50 µm. A further portion of the drift structure 130 separates the second reinforcement stripes 362 from the trench structures 300.

The first and second reinforcement stripes 361, 362 may be from different materials or may be from the same material(s). For example, the first and second reinforcement stripes 361, 362 may be from semiconductor oxide, for example silicon oxide, semiconductor nitride, for example silicon nitride, semiconductor oxynitride, for example silicon oxynitride, silicon carbide, carbon, e.g., DLC or any combination thereof. According to a further embodiment the material of the first reinforcement stripes 361, or the second reinforcement stripes 362, or of both is or contains a stable metal that is inert with respect to silicon, e.g., tungsten W.

A vertical extension of the first and second reinforcement stripes 361, 362 may be between 50 nm and 5 µm, wherein the first and second reinforcement stripes 361, 362 may have the same vertical extension or may have different vertical extensions.

A transversal horizontal extension of the first and second reinforcement stripes 361, 362 may be in a range from 500 nm to 20 µm, e.g., from 1 µm to 10 µm, wherein the first and second reinforcement stripes 361, 362 may have the same horizontal transverse dimension or different horizontal transverse dimensions.

A center-to-center distance between neighboring first reinforcement stripes 361 and between neighboring second reinforcement stripes 362 may be in a range from 50 nm to 500 µm, wherein the first reinforcement stripes 361 and the second reinforcement stripes 362 may have the same or different center-to-center distances. A spacing of the first reinforcement stripes 361 as well as a spacing of the second reinforcement stripes 362 may be uniform across the semiconductor device 500. According to another embodiment, the distances between neighboring first reinforcement stripes 361 and/or between neighboring second reinforcement stripes 362 may increase with increasing distance to the lateral outer surface 103.

A longitudinal horizontal dimension of the first and second reinforcement stripes 361, 362 may be at least ten times the horizontal transverse dimension. The first and second reinforcement stripes 361, 362 may extend from one side of the semiconductor portion 100 to the opposite side or may be segmented along the longitudinal axis.

The first and second reinforcement stripes 361, 362 may form regular patterns across the complete horizontal cross-section of the semiconductor device 500 or may spare regions of the semiconductor device 500, for example a central region in the vertical projection of the trench structures 300.

A distance between the first reinforcement stripes 361 and/or between the second reinforcement stripes 362 may be greater in the central portion of the semiconductor device 500 than in a peripheral portion close to the lateral outer surface 103.

Figure 2C:
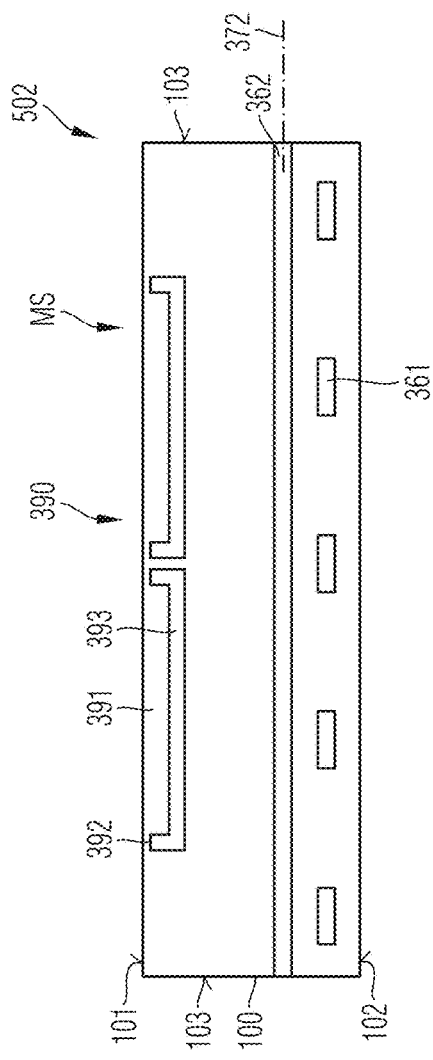
FIG. 2C is a schematic vertical cross-sectional view of a micro electromechanical device with orthogonal reinforcement stripes in different planes according to an embodiment.
Figure 2D:
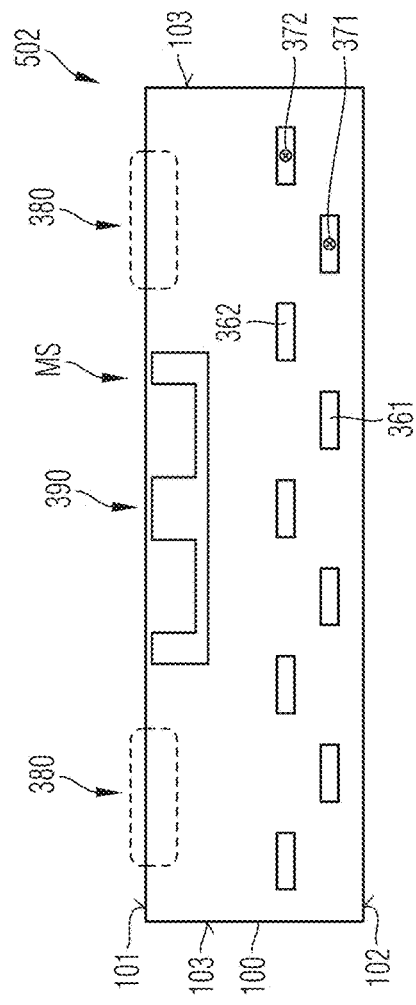
FIG. 2D is a schematic vertical cross-sectional view of a micro electromechanical device with parallel reinforcement stripes in different planes according to an embodiment.

FIGS. 2C and 2D refer to micro electromechanical devices 502 that may be obtained from semiconductor substrate 500a and the process described with reference to FIGS. 1A to 1F.

In FIG. 2C the micro electromechanical device 502 may be or may be part of a micro electromechanical system, e.g., an accelerometer, gyroscope, microphone, microfluidic system, pressure sensor, chemo sensor, or biosensor, by way of example. In the illustrated embodiment the micro electromechanical device 502 includes a micro electromechanical structure MS with micromechanical components of an accelerometer 390. Deformable beams 392 from the second epitaxial layer 100c of FIGS. 1A to 1F or from a layer formed on the second epitaxial layer 100c connect a mass 391, which is formed in a chamber 393, to a frame portion of the semiconductor portion 100. Electric sensors, e.g., capacitive sensors may determine the position of the mass 391 with respect to a center of the chamber 393.

FIG. 2D refers to a micro electromechanical device 502 that includes electronic circuits 380 in addition to a micro electromechanical structure MS with micromechanical components of, e.g., an accelerometer 390, wherein semiconducting portions of the electronic circuits 380 may be formed in the semiconductor portion 100. The electronic circuits 380 may process and output signals obtained from the electric sensors of the micro electromechanical structure MS. In the illustrated embodiment, the first and second longitudinal axes of the first and second reinforcement stripes 361, 362 are parallel to each other.

Figure 3A:
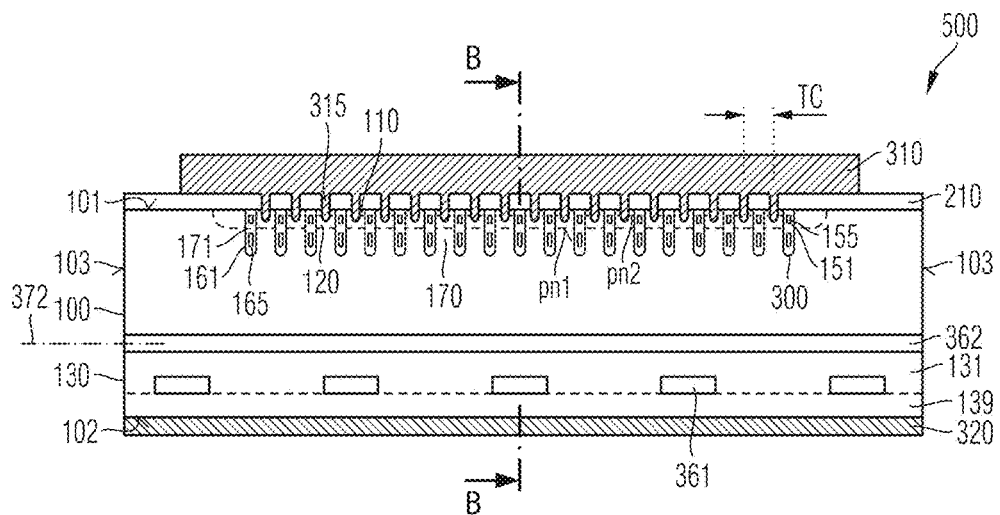
FIG. 3A is a schematic vertical cross-sectional view of a semiconductor device according to an embodiment with stripe-shaped combined gate/compensation structures.
Figure 3B:
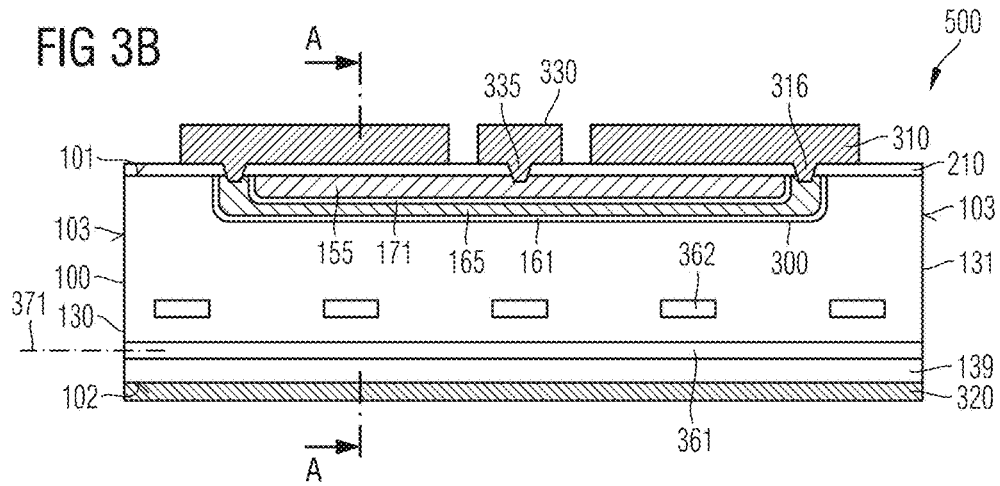
FIG. 3B is a schematic vertical cross-sectional view of the semiconductor device of FIG. 3A along line B-B.

FIGS. 3A and 3B refer to a semiconductor device 500 with transistor cells TC formed at the front side, wherein the trench structures 300 include gate electrodes 155, gate dielectrics 151 separating the gate electrodes 155 from the semiconductor material of the semiconductor portion 100, field electrodes 165, field dielectrics 161 separating the field electrodes 165 from the semiconductor portion 100 and separation dielectrics 171 separating the gate electrodes 155 from the field electrodes 165.

Mesa sections 170 of the semiconductor portion 100 between neighboring trench structures 300 may include body regions 120 of the transistor cells TC, wherein each body region 120 forms a first pn junction pn1 with the drift structure 130, e.g., the drift zone 131, and second pn junctions pn2 with source regions 110 in the mesa sections 170. The semiconductor portion 100 further includes first reinforcement stripes 361 and second reinforcement stripes 362 as described with reference to FIGS. 2A and 2B.

An interlayer dielectric 210 is formed on the first surface 101. The interlayer dielectric 210 may include one or more dielectric layers from thermal silicon oxide, deposited silicon oxide, a silicate glass such as BSG (boron silicate glass), PSG (phosphorus silicate glass), BPSG (boron-phosphorus silicate glass), FSG (fluorosilicate glass), and a spin-onglass. A front side metallization includes a first load electrode 310. First contact structures 315 extending through the interlayer dielectric 210 electrically connect the first load electrode 310 with the source and body regions 110, 120 in the mesa sections 170. Second contact structures 316 may electrically connect the first load electrode 310 with the field electrodes 165. The front side metallization may further include a gate conductor 330, wherein gate contacts 335 extending through the interlayer dielectric 210 electrically connect the gate conductor 330 with the gate electrodes 155.

A back side metallization on the second surface 102 directly adjoins the contact portion 139 and includes a second load electrode 320. In the on-state of the semiconductor device 500 a load current flows in a vertical direction through the semiconductor portion 100 between the first and second load electrodes 310, 320.

The first reinforcement stripes 361 may be evenly spaced from each other and the second reinforcement stripes 362 may be evenly spaced from each other.

Figure 4A:
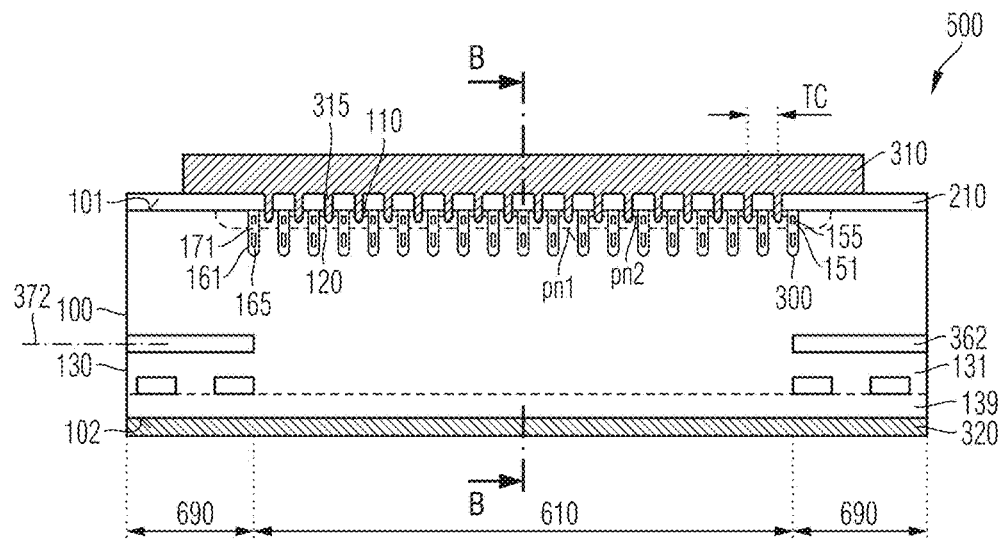
FIG. 4A is a schematic vertical cross-sectional view of a semiconductor device according to an embodiment concerning reinforcement stripes sparing a central region of a semiconductor device.
Figure 4B:
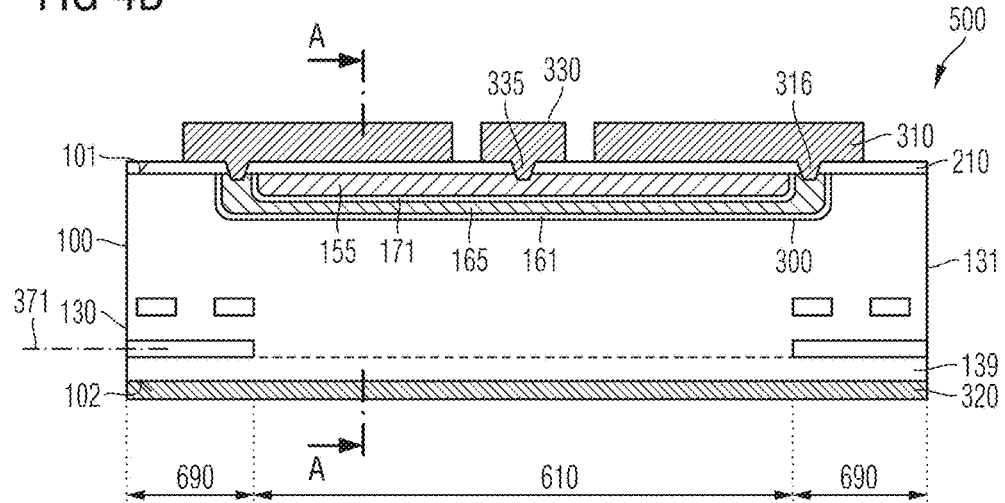
FIG. 4B is a schematic vertical cross-sectional view of the semiconductor device of FIG. 4A along line B-B.

In the semiconductor device 500 of FIGS. 4A and 4B both the first and the second reinforcement stripes 361, 362 are formed only in a peripheral portion 690 along the lateral outer surface 103. A central portion 610 surrounded by the peripheral portion 690 is devoid of both first and second reinforcement stripes 361, 362. According to other embodiments, the central portion 610 may be devoid of only one of the first and second reinforcement stripes 361, 362. The central portion 610 may coincide with a transistor cell region in which the transistor cells TC are formed such that the reinforcement stripes 361, 362 do not adversely affect the on-state resistance of the semiconductor device 500. According to other embodiments the central portion 610 coincides with only a central section of the transistor cell region.

FIG. 5A to FIG. 5H concern a process for manufacturing semiconductor devices by using buried dicing stripes for separating semiconductor dies formed in the same semiconductor substrate 500a.

On a process surface 101a of a semiconducting portion of a base substrate bow dicing stripes 365 are formed by photolithography as described above with reference to FIGS. 1A to 1G for the first and second reinforcement stripes 361, 362.

The process for forming the dicing stripes 365 from a continuous dicing layer may be highly anisotropic such that the sidewalls tilted to the process surface 101a are approximately vertical.

Figure 5A:
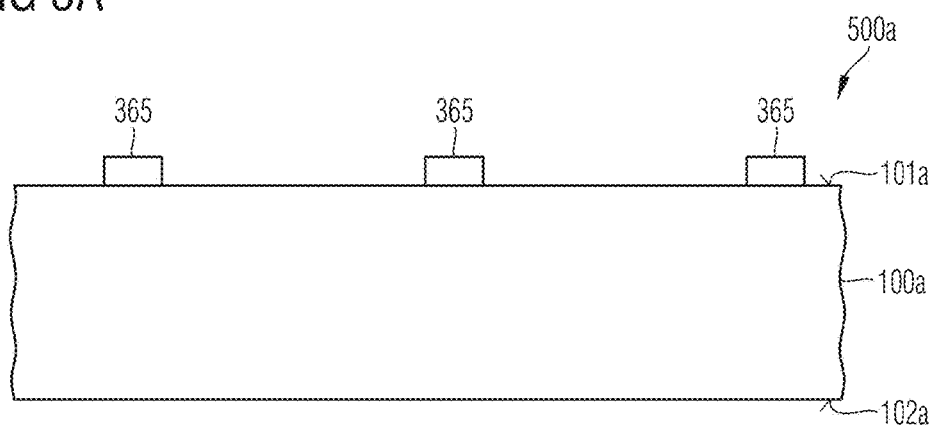
FIG. 5A is a schematic vertical cross-sectional view of a portion of a semiconductor substrate for illustrating a method of manufacturing semiconductor devices including wafer dicing along buried dicing stripes according to an embodiment, after forming dicing stripes on a base substrate.

The dicing stripes 365 shown in FIG. 5A may be connected to each other to form a complete regular grid on the process surface 101a. The grid may be continuous. According to other embodiments, the grid may include a plurality of narrowly spaced line portions. A horizontal width of the dicing stripes 365 may be in a range from 0.5 µm to 20 µm, for example in a range from 1 µm to 10 µm. A vertical extension may be in a range from 50 nm to 1 µm. The distance between neighboring dicing stripes 365 corresponds to an edge length of the finalized semiconductor device. The material of the dicing stripes 365 may be silicon oxide, silicon nitride, silicon oxynitride, silicon carbide, carbon, a stable metal inert with respect to silicon, e.g., tungsten or any combination thereof.

An epitaxial layer 100b is grown by epitaxy on exposed surface portions of the process surface 101a. The process parameters of the epitaxy process may be selected such that the first epitaxial layer 100b completely overgrows the dicing stripes 365. According to another embodiment, an anneal in an hydrogen-containing ambient may partially fluidify a grown epitaxial layer such that after recrystallization the first epitaxial layer 100b fills any void possibly formed in the vertical projection of the dicing stripes 365. According to a further embodiment, the epitaxy may leave closed voids in the vertical projection of the dicing stripes 365.

Figure 5B:
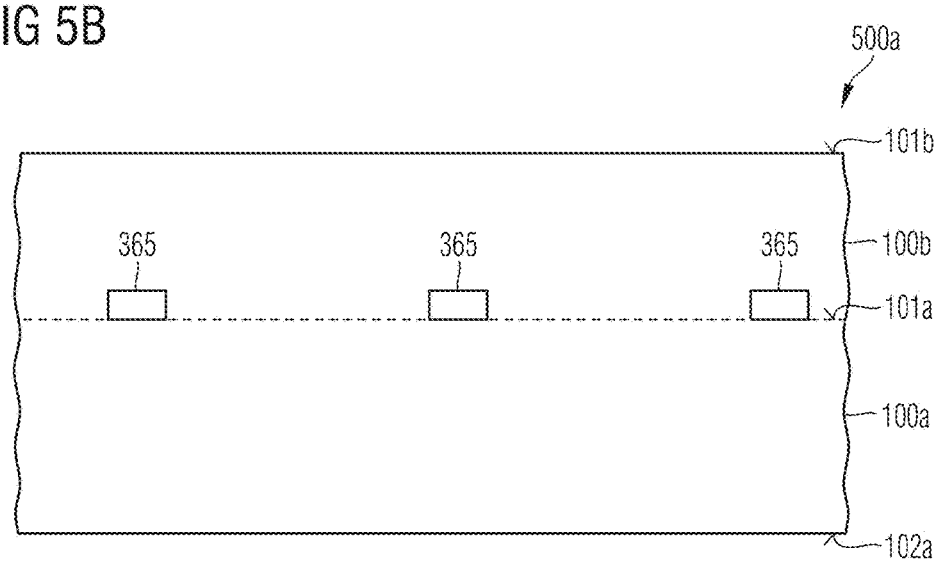
FIG. 5B is a schematic vertical cross-sectional view of the semiconductor substrate portion of FIG. 5A, after forming a first epitaxial layer overgrowing the dicing stripes.

The epitaxial layer 100b shown in FIG. 5B may have an approximately uniform dopant concentration different from a dopant concentration in the semiconducting portion of the base substrate bow. According to other embodiments, a vertical dopant profile in the first epitaxial layer 100b may vary as a function of a distance to the process surface 101a.

Semiconductor dies 501 with transistor cells TC may be formed in portions of the epitaxial layer 100b framed by the dicing stripes 365. The semiconductor dies 501 may be dies of power semiconductor devices with a vertical load current flow between a front side and a rear side of the semiconductor device. A front side metallization including first load electrodes 310 at the exposed front side of the semiconductor dies 501 are formed, wherein metallizations of neighboring semiconductor dies 501 are separated from each other by a patterning process. By using the patterned metallization at the front side or by a further patterning process, dicing trenches 370 may be etched into portions of the first epitaxial layer 100b in the vertical projection of the dicing stripes 365.

Figure 5C:
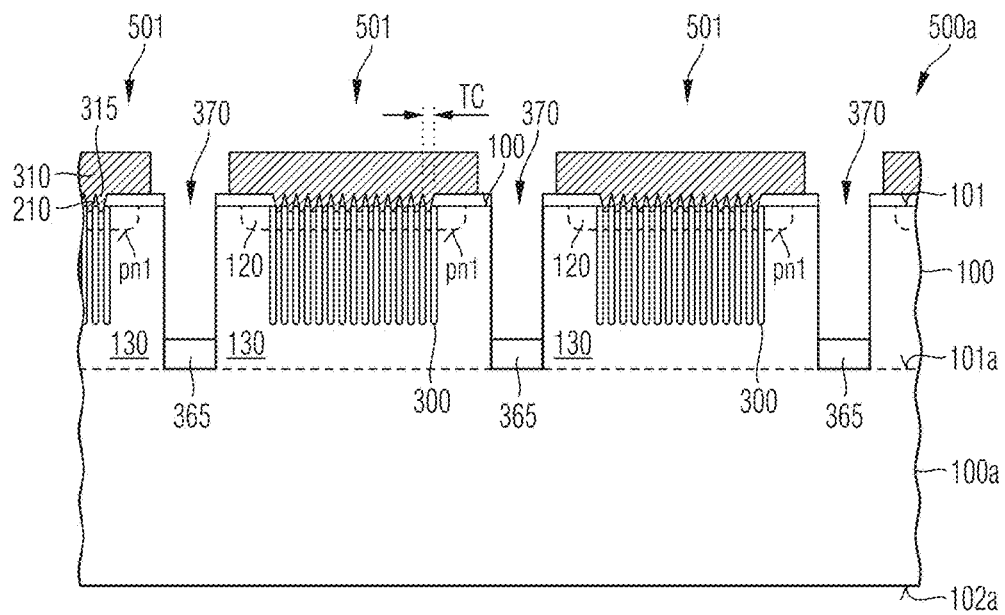
FIG. 5C is a schematic vertical cross-sectional view of the semiconductor substrate portion of FIG. 5B, after forming dicing trenches exposing the dicing stripes.

FIG. 5C shows the semiconductor substrate 500a with the base substrate bow and semiconductor dies 501 with semiconductor portions 100 formed from the epitaxial layer 100b of FIG. 5B. The semiconductor dies 501 may include portions of micro electromechanical structures and/or transistor cells TC with body regions 120 forming first pn junctions pn1 with a drift structure 130, which is formed outside of the body regions 120 in the epitaxial layer 100b, and second pn junctions with source regions formed between the body regions 120 and a first surface 101 at the front side of the semiconductor portion 100. Trench structures 300 extend from the first surface 101 into the semiconductor portions 100. First contact structures 315 may electrically connect the first load electrodes 310 with the source regions and with the body regions 120 of the transistor cells TC.

The dicing trenches 370 extend between the metallizations of neighboring semiconductor dies 501 through the interlayer dielectric 210 into the first epitaxial layer 100b of FIG. 5B and expose portions of the dicing stripes 365. The dicing trenches 370 may be at least partly lined with a protection liner, e.g., a silicon oxide liner and/or may be filled with a sacrificial material 375, e.g., silicon oxide, or a resin, such as an adhesive resin to hold the semiconductor dies 501 at their position after removal of the dicing stripes 365.

An auxiliary carrier 400 is attached to the front side metallization including the first load electrodes 310.

Figure 5D:
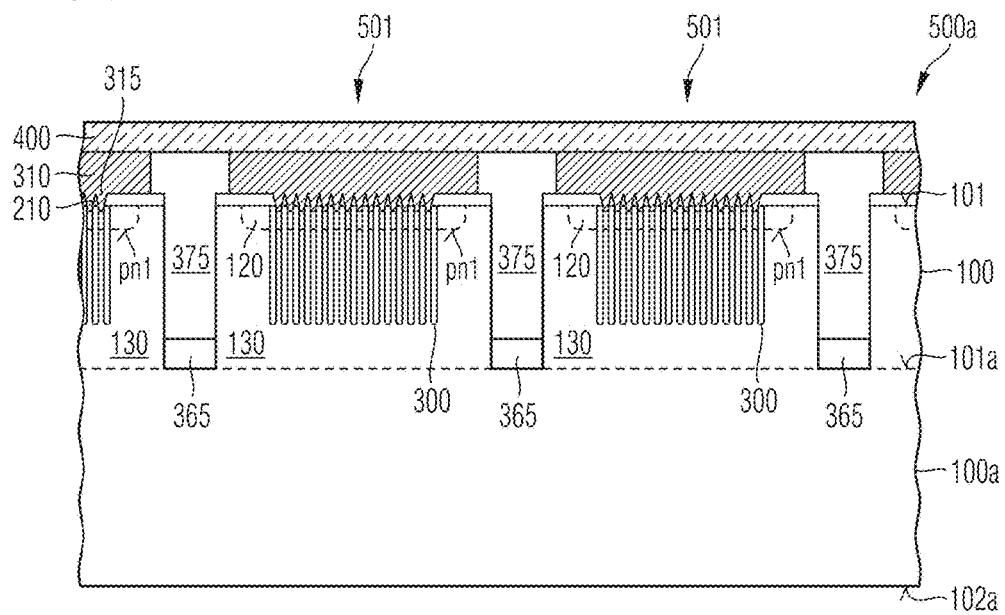
FIG. 5D is a schematic vertical cross-sectional view of the semiconductor substrate portion of FIG. 5C, after attaching an auxiliary carrier at a front side of the semiconductor substrate.

The auxiliary carrier 400 in FIG. 5D may be a silicon disc or a glass disc, by way of example. The auxiliary carrier 400 stabilizes the semiconductor substrate 500a in the following processes which may completely remove the base substrate bow, for example, by grinding or by a process combining etch processes with grinding and/or polishing processes. A CMP (chemical-mechanical polishing) may remove at least a last portion of the base substrate bow, wherein the process may detect exposure of the dicing stripes 365 and may use detection of the dicing stripes 365 as polishing stop signal.

Figure 5E:
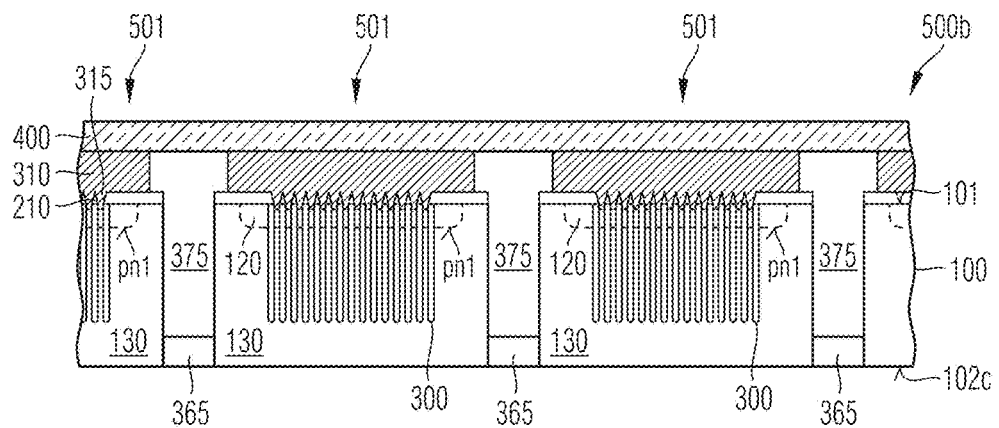
FIG. 5E is a schematic vertical cross-sectional view of a semiconductor die composite obtained from the semiconductor substrate portion of FIG. 5D by removing the base substrate.

FIG. 5E shows a semiconductor die composite 500b including the auxiliary carrier 400 and a plurality of identical semiconductor dies 501 attached to the auxiliary carrier 400 and separated from each other by the sacrificial material 375 in the dicing trenches and the dicing stripes 365. Removal of the base substrate bow of FIG. 5D exposes second process surfaces 102C on the back of the semiconductor dies 501.

A back side metallization including second load electrodes 320 is formed on the back of the semiconductor dies 501 opposite to the front side metallization including the first load electrode 310.

For example, the semiconductor portions 100 of the semiconductor dies 501 are selectively recessed from the back, wherein the vertical extensions of the recess is smaller than the vertical extension of the dicing stripes 365. Dopants may be implanted through the recessed second surfaces 102 of the semiconductor dies 501. For example, a heavily doped contact portion 139 with a dopant concentration sufficiently high to ensure an ohmic contact with a metal may be implanted through the second surfaces 102. In addition, dopants for a lower doped field stop layer may be implanted through the second surfaces 102.

Figure 5F:
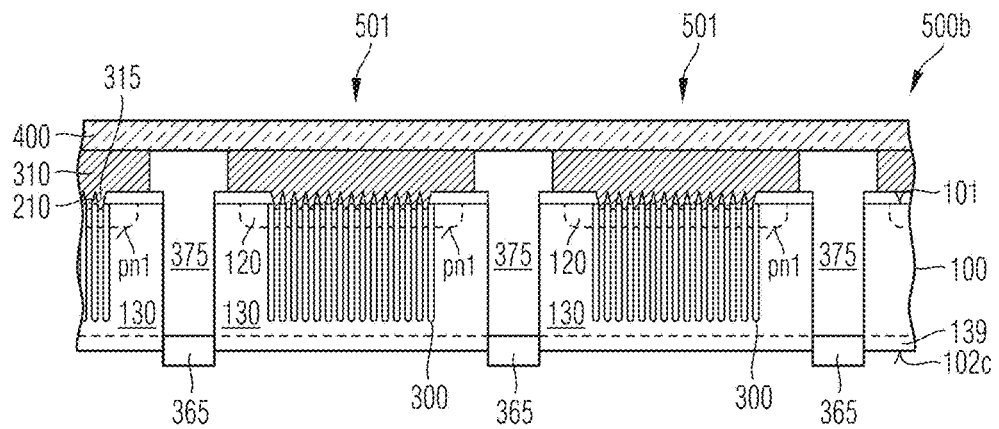
FIG. 5F is a schematic vertical cross-sectional view of the semiconductor die composite of FIG. 5E, after recessing the first epitaxial layer between the dicing stripes.

FIG. 5F shows the recessed semiconductor portions 100 and heavily doped contact portions 139 formed along the surface 102 of the semiconductor dies 500. The dicing stripes 365 protrude from the second surface 102 such that sidewalls of the dicing stripes 365 are partially exposed.

A metal-containing layer or layer stack including one or more metal-containing layers, e.g., metal alloys is deposited. Portions of the deposited metal-containing layer or layer stack formed on an exposed surface of the dicing stripes 365 may be removed, for example by a polishing step.

Figure 5G:
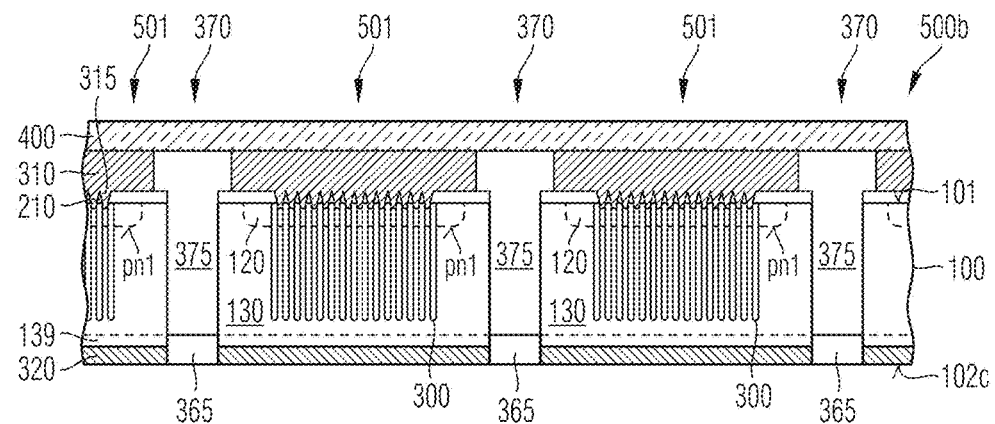
FIG. 5G is a schematic vertical cross-sectional view of the semiconductor die composite of FIG. 5F, after forming a back side metallization on the back of the semiconductor dies by depositing a metal and planarizing the deposited metal to expose the dicing stripes.

FIG. 5G shows back side metallizations including second load electrodes 320 in the meshes of the grid formed by the dicing stripes 365.

The semiconductor dies 501 are separated from each other. For example, a selective etch, e.g., an oxide etch in case the dicing stripes 365 are of silicon oxide, may remove the dicing stripes 365, and, if applicable, the sacrificial material 375 in the dicing trenches 370.

Figure 5H:
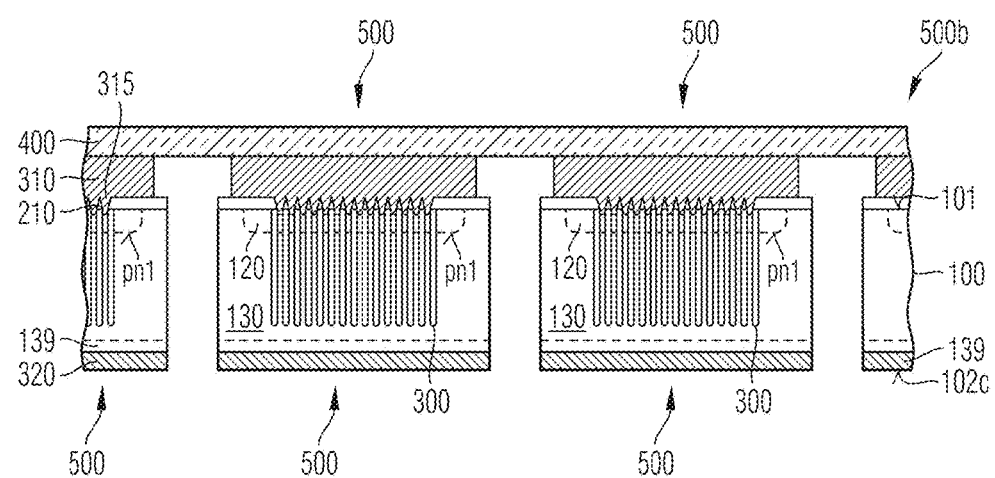
FIG. 5H is a schematic vertical cross-sectional view of the semiconductor die composite of FIG. 5G, after removing the dicing stripes.

FIG. 5H shows the semiconductor die composite 500b with separated semiconductor devices 500 obtained from the semiconductor dies 501 of FIG. 5G and attached to the auxiliary carrier 400. From the auxiliary carrier 400, the semiconductor devices 500 may be picked up and forwarded to further processing that may include, for example, wire bonding and chip packaging.

According to another embodiment, the dicing stripes 365 are sawed through such that a continuous oxide ring surrounds the semiconductor devices 500 along the second surface 102.

FIGS. 6A to 6G concern a process using tapering dicing stripes 365. A process for forming the dicing stripes 365 from a grown or deposited dicing layer includes a highly isotropic component.

Figure 6A:
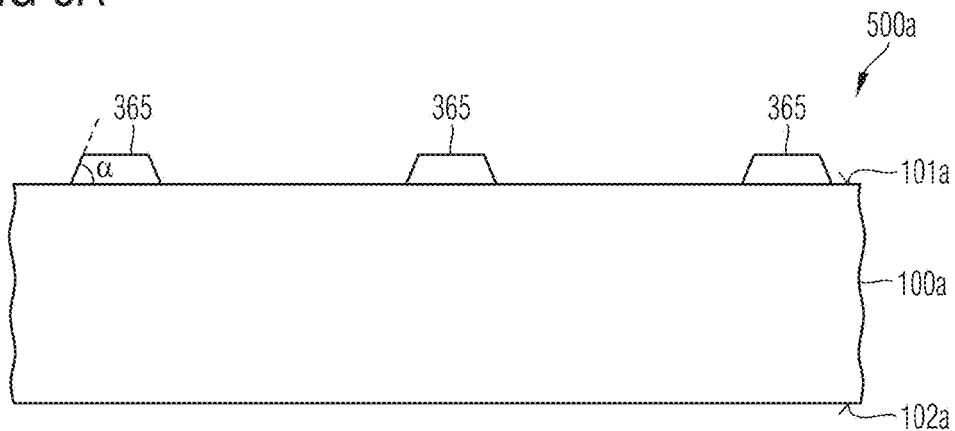
FIG. 6A is a schematic vertical cross-sectional view of a portion of a semiconductor substrate for illustrating a method of manufacturing a semiconductor device including wafer dicing, after forming tapering dicing stripes.

As illustrated in FIG. 6A sidewalls of dicing stripes 365 resulting from etching with an isotropic component are tilted to the process surface 101a of the base substrate bow. The dicing stripes 365 taper with increasing distance to the process surface 101a. A slope angle α with respect to the process surface 101a may be in a range from 30° to 70°, e.g., from about 45° to about 60°.

Figure 6B:
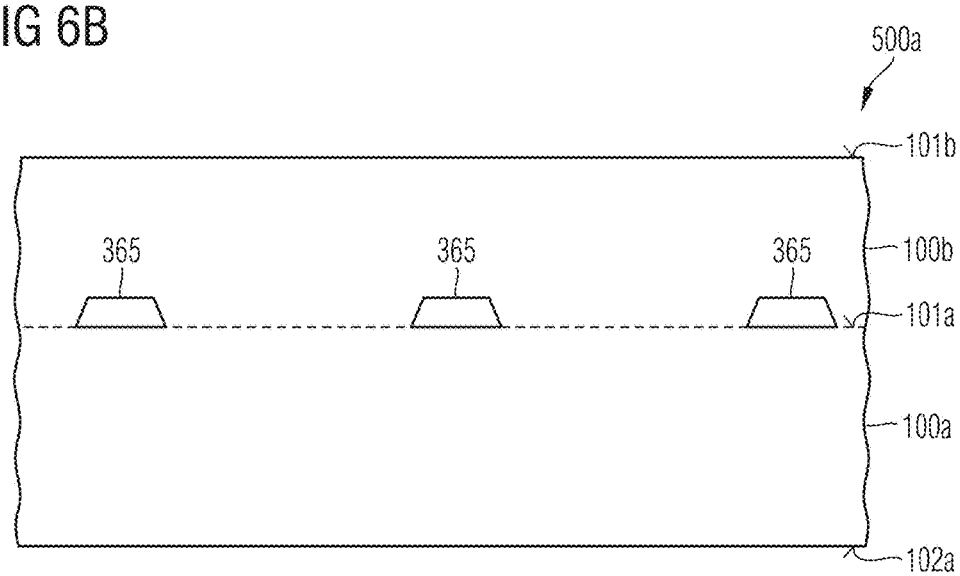
FIG. 6B is a schematic vertical cross-sectional view of the semiconductor substrate portion of FIG. 6A, after forming a first epitaxial layer overgrowing the tapering dicing stripes.

An epitaxial layer 100b overgrows the dicing stripes 365 as shown in FIG. 6B.

Portions of micro electromechanical structures may be formed in semiconductor dies 501 formed from portions of the grown epitaxial layer 100b. According to the illustrated embodiment transistor cells TC and a front side metallization including first load electrodes 310 at a front side of semiconductor dies 501 are formed on the grown epitaxial layer 100b. By using the patterned front side metallization alone, by using the patterned metallization in combination with a further patterning process or by an independent additional patterning process, dicing trenches 370 are formed that separate semiconductor portions 100 of semiconductor dies 501 formed from the epitaxial layer 100b of FIG. 6B.

FIG. 6C shows the dicing trenches 370 exposing the tapering dicing stripes 365. The dicing trenches 370 may remain unfilled or may be filled with sacrificial material and/or at least partly lined with a protection liner.

An auxiliary carrier 40o is attached at the front side of the semiconductor dies 501 as shown in FIG. 6D and the base substrate bow is removed, e.g., by grinding.

Figure 6E:
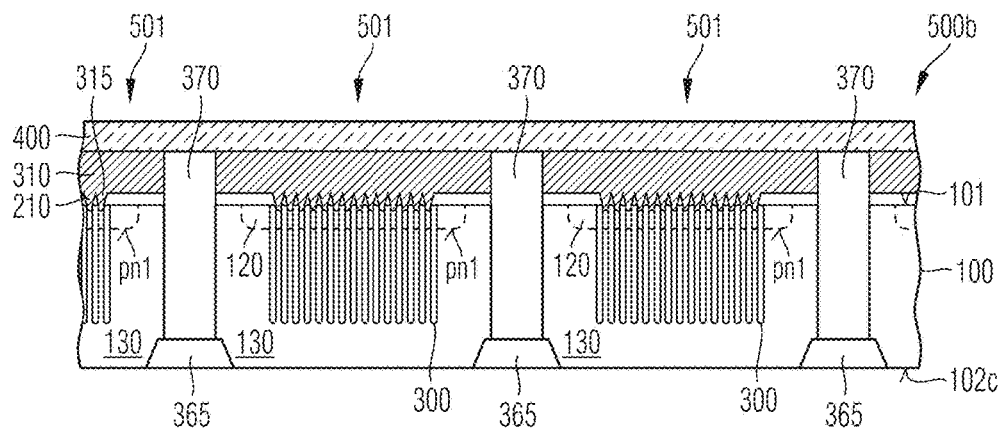
FIG. 6E is a schematic vertical cross-sectional view of a semiconductor die composite obtained from the semiconductor substrate portion of FIG. 6D by removing the base substrate.

FIG. 6E shows a semiconductor die composite 500b with the exposed tapering dicing stripes 365.

An etch process with an isotropic component selectively recesses the semiconductor portions 100 between the dicing stripes 365 and partially undercuts the tapering dicing stripes 365. One or more metal-containing layers are deposited onto the rear side. A thickness of the deposited metal-containing layer(s) is less than a vertical extension of the recess of the semiconductor portions 100.

Figure 6F:
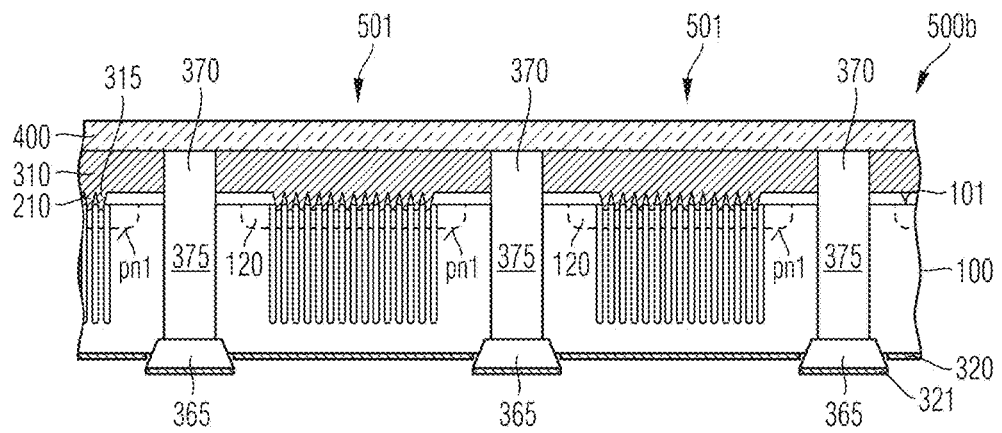
FIG. 6F is a schematic vertical cross-sectional view of the semiconductor die composite of FIG. 6E, after recessing the first epitaxial layer and forming a back side metallization.

As shown in FIG. 6F, the deposition process forms a back side metallization including second load electrodes 320 on the second surface 102 of the semiconductor dies 501. Excess portions 321 of the deposited metal-containing layers cover the exposed surface of the dicing stripes 365. The tapering dicing stripes 365 shadow edge sections of the semiconductor portions 100 against the deposition process such that edge portions of the second surface 102 along the lateral outer surface remain exposed.

A further isotropic process effective on the exposed semiconductor portions 100 may lift off the dicing stripes 365.

Figure 6G:
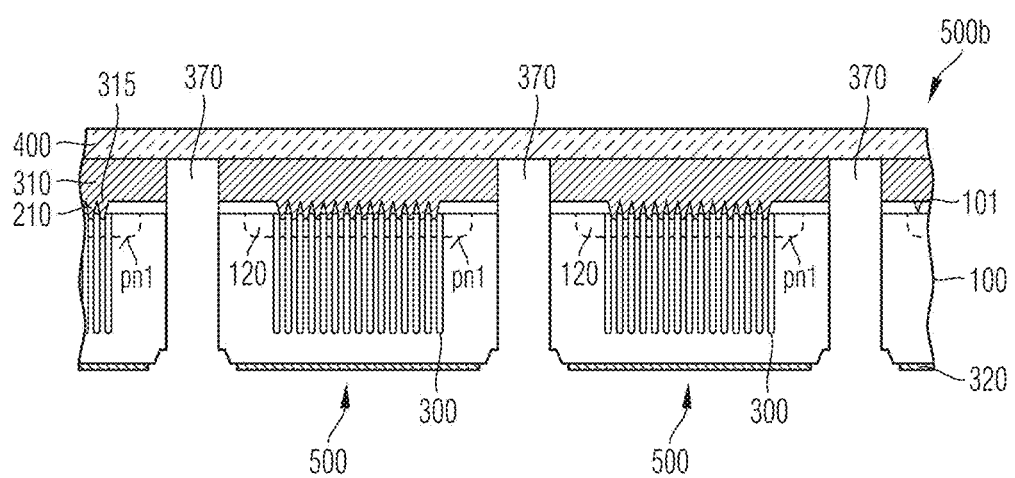
FIG. 6G is a schematic vertical cross-sectional view of the semiconductor die composite of FIG. 6F, after removing the dicing stripes.

FIG. 6G shows the semiconductor die composite 500b with separated semiconductor devices 500 after removal of the dicing stripes 365.

According to another embodiment, the dicing stripes 365 are sawed through such that a continuous oxide ring surrounds the semiconductor devices 500 along the second surface 102.

Figure 7A:
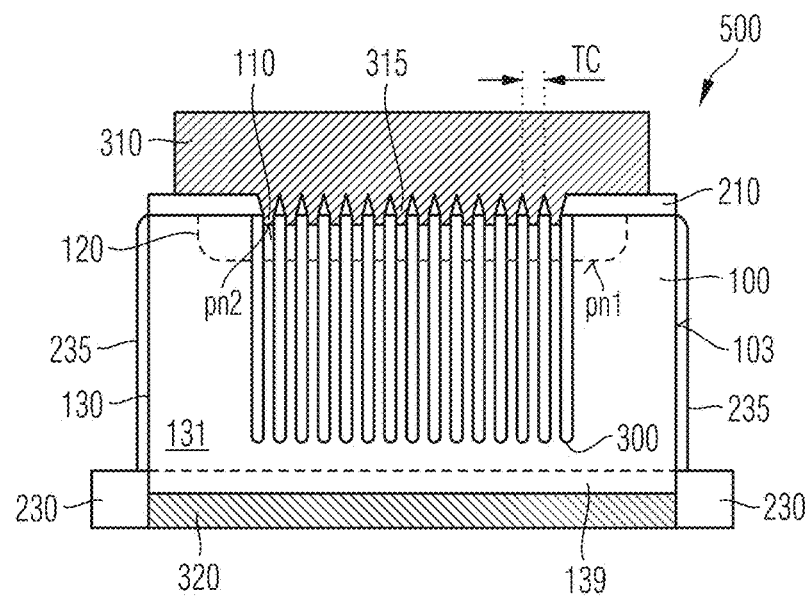
FIG. 7A is a schematic vertical cross-sectional view of a semiconductor device obtained by sawing or cutting through the dicing stripes 365 of FIG. 5G.

The semiconductor device 500 of FIG. 7A includes an oxide ring 230 formed from remnants of the dicing stripes 365 of FIG. 5G, wherein the semiconductor dies 501 of FIG. 5G are separated by a sawing or laser cutting process cutting through the dicing stripes 365. A protection liner 235 lining the dicing trenches 370 of FIG. 5G may cover the exposed lateral outer surface 103 of the semiconductor portion 100.

Figure 7B:
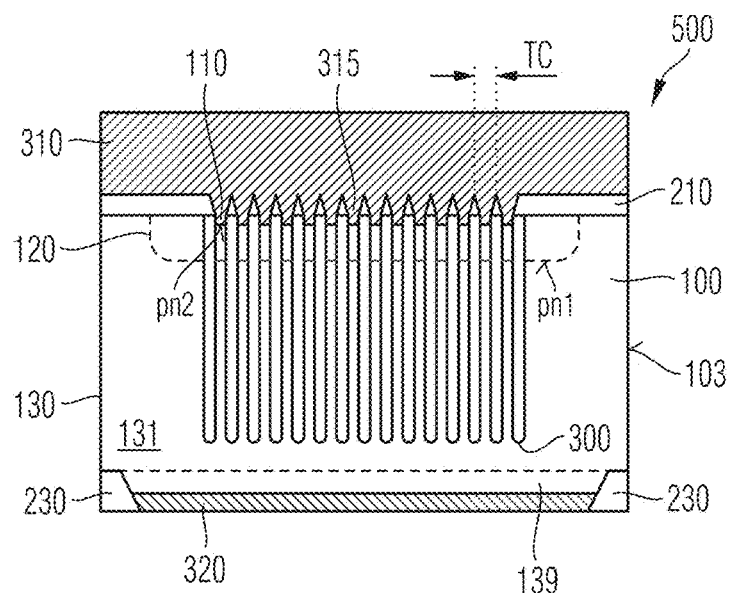
FIG. 7B is a schematic vertical cross-sectional view of a semiconductor device obtained by sawing or cutting through the dicing stripes 365 of FIG. 6F.

The semiconductor device 500 of FIG. 7B may be obtained by a similar process using tapering dicing stripes. The lateral outer surface 103 may be covered by a native semiconductor oxide or by a protection liner deposited to line the dicing trenches 370 of FIG. 6F.

In all embodiments, the dicing stripes 365, the first reinforcement stripes 361 and/or the second reinforcement stripes 362 may be used to separate active areas in the same semiconductor device 500 from each other, for example low-voltage regions from high-voltage regions or sensor regions from regions conveying the load current.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   transistor cells comprising body regions that form first pn junctions with a drift structure in a semiconductor portion;
   first reinforcement stripes in the semiconductor portion, wherein first longitudinal axes of the first reinforcement stripes are parallel to a first surface of the semiconductor portion; and
   second reinforcement stripes between the first reinforcement stripes and the first surface, wherein second longitudinal axes of the second reinforcement stripes are parallel to the first surface,
   wherein the second longitudinal axes are orthogonal to the first longitudinal axes.

2. The semiconductor device of claim 1, wherein the second longitudinal axes are tilted to the first longitudinal axes.

3. The semiconductor device of claim 1, wherein the body regions of the transistor cells form second pn junctions with source regions formed between the first surface and the body regions.

4. The semiconductor device of claim 1, wherein a separation section of the drift structure separates the first and second reinforcement stripes.

5. The semiconductor device of claim 1, wherein an intermediate section of the semiconductor portion separates the first reinforcement stripes from a second surface of the semiconductor portion opposite to the first surface.

6. The semiconductor device of claim 1, wherein the first and second reinforcement stripes comprise at least one of silicon oxide, silicon nitride, silicon carbide, diamond-like carbon, and a metal inert against silicon.

7. The semiconductor device of claim 1, wherein a width of the first and second reinforcement stripes is in a range from 50 μm to 500 μm.

8. The semiconductor device of claim 1, wherein the first and second reinforcement stripes extend through a central portion of the semiconductor portion.

9. The semiconductor device of claim 1, wherein the first and second reinforcement stripes spare a central portion of the semiconductor portion.

10. The semiconductor device of claim 1, wherein at least the first or the second reinforcement stripes have a uniform center-to-center distance.

11. A micro electromechanical device comprising:
    a micro electromechanical structure formed in a semiconductor portion;
    first reinforcement stripes in the semiconductor portion, wherein first longitudinal axes of the first reinforcement stripes are parallel to a first surface of the semiconductor portion; and
    second reinforcement stripes between the first reinforcement stripes and the first surface, wherein second longitudinal axes of the second reinforcement stripes are parallel to the first surface,
    wherein the second longitudinal axes are orthogonal to the first longitudinal axes.

12. The micro electromechanical device of claim 11, wherein the second longitudinal axes are tilted to the first longitudinal axes.

13. A method of manufacturing a semiconductor device, the method comprising:
    forming first reinforcement stripes on a process surface of a base substrate;
    forming a first epitaxial layer on the process surface, the first epitaxial layer covering the first reinforcement stripes;
    forming second reinforcement stripes on the first epitaxial layer;
    forming a second epitaxial layer on exposed portions of the first epitaxial layer, the second epitaxial layer covering the second reinforcement stripes;
    forming semiconducting portions of transistor cells in or portions of micro electromechanical structures from the second epitaxial layer; and
    removing at least a portion of the base substrate from a side opposite to the first epitaxial layer.

14. The method of claim 13, wherein the first and second reinforcement stripes comprise at least one of silicon oxide, silicon nitride, diamond-like carbon, silicon carbide, and a metal inert against silicon.

15. The method of claim 13, wherein second longitudinal axes of the second reinforcement stripes are tilted to first longitudinal axes of the first reinforcement stripes.

16. The method of claim 13, wherein forming semiconducting portions of the transistor cells comprises forming body regions that form first pn junctions with a drift structure in the second epitaxial layer and second pn junctions with source regions formed in the second epitaxial layer between a main surface and the body regions.

17. A method of manufacturing a semiconductor device, the method comprising:
    forming dicing stripes on a process surface of a base substrate;
    forming an epitaxial layer on the process surface, the epitaxial layer covering the dicing stripes;
    forming semiconducting portions of transistor cells in portions of micro electromechanical structures from the epitaxial layer;
    forming dicing trenches in a vertical projection of the dicing stripes and separating semiconductor portions of semiconductor dies;
    attaching an auxiliary carrier at a front side opposite to the base substrate;
    removing the base substrate; and
    separating the semiconductor dies by at least partially removing the dicing stripes.

18. The method of claim 17, further comprising filling the dicing trenches with a sacrificial material before attaching the auxiliary carrier.

19. The method of claim 17, wherein the dicing stripes taper with increasing distance to the process surface.

20. The method of claim 17, further comprising:
    recessing, selectively against the dicing stripes, a surface of the epitaxial layer exposed by removing the base substrate; and
    forming, after removing the base substrate, a back side metallization on an exposed surface of the epitaxial layer.

21. The method of claim 20, wherein tapering protruding portions of the dicing stripes shadow edge portions of the recessed surface of the epitaxial layer.

22. The method of claim 21, further comprising isotropically etching, after forming the back side metallization, exposed edge portions of the recessed epitaxial layer, wherein the dicing stripes are lifted off.

* * * * *